United States Patent
Lin

(10) Patent No.: US 8,014,124 B2
(45) Date of Patent: Sep. 6, 2011

(54) THREE-TERMINAL METAL-OXIDE-METAL CAPACITOR

(75) Inventor: Tser-Yu Lin, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 282 days.

(21) Appl. No.: 12/477,139

(22) Filed: Jun. 3, 2009

(65) Prior Publication Data
US 2010/0309605 A1    Dec. 9, 2010

(51) Int. Cl.
*H01G 4/228*    (2006.01)
(52) U.S. Cl. ............... 361/306.3; 361/306.1; 361/306.2; 361/311; 361/313; 361/301.4
(58) Field of Classification Search ............... 361/306.3, 361/303–305, 301.2, 301.4, 311–313, 321.2, 361/308.1; 257/294–295
See application file for complete search history.

(56) References Cited

U.S. PATENT DOCUMENTS

| | | | | |
|---|---|---|---|---|
| 5,208,725 | A * | 5/1993 | Akcasu ..................... | 361/313 |
| 5,978,206 | A * | 11/1999 | Nishimura et al. ........... | 361/303 |
| 6,178,083 | B1 * | 1/2001 | Appeltans et al. ......... | 361/306.1 |
| 6,297,524 | B1 * | 10/2001 | Vathulya et al. ............. | 257/303 |
| 6,822,312 | B2 * | 11/2004 | Sowlati et al. ............... | 257/532 |
| 7,154,734 | B2 * | 12/2006 | Schultz et al. ............. | 361/306.1 |
| 7,485,912 | B2 * | 2/2009 | Wang ........................... | 257/307 |

OTHER PUBLICATIONS

Jerry (Heng-Chih) Lin, A Low-Phase-Noise 0.004-ppm/Step DCXO With Guaranteed Monotonicity in the 90-nm CMOS Process, Dec. 2005.
Roberto Aparicio, Capacity Limits and Matching Properties of Integrated Capacitors, Mar. 2002.

* cited by examiner

*Primary Examiner* — Nguyen T Ha
(74) *Attorney, Agent, or Firm* — Winston Hsu; Scott Margo

(57) ABSTRACT

An MOM capacitor includes a first metal plate; a second metal plate in close proximity to the first metal plate; a third metal plate in close proximity to the first metal plate, and at least one oxide layer interposed between the first, second and three vertical metal plates. The first, second and third metal plate are connected to three different terminals of an integrated circuit.

18 Claims, 11 Drawing Sheets

THREE-TERMINAL METAL-OXIDE-METAL CAPACITOR

BACKGROUND OF THE INVENTION

1. Field of the Invention

The present invention relates to a semiconductor capacitor, and more particularly, to a compact, three-terminal or multi-terminal metal-oxide-metal (MOM) capacitor.

2. Description of the Prior Art

Passive components such as capacitors are extensively used in integrated circuit (IC) design for radio-frequency (RF) and mixed-signal applications, such as bypassing, inter-stage coupling, and in resonant circuits and filters. One of the most commonly used capacitors is the metal-oxide-metal (MOM) capacitor.

FIG. 1 illustrates a typical MOM capacitor. As shown in FIG. 1, the MOM capacitor 10 includes interdigitated multi-fingers 12 and 14 that are formed in multiple metal layers. The interdigitated multi-fingers are optionally connected by vias 16 and 18 in the vertical BEOL (back-end-of-line) stack separated by inter-metal dielectrics (not explicitly shown). The fabricating process of an MOM capacitor can be integrated with the connect process. Hence, no extra photo mask is required. For example, the dual-damascene techniques typically used with copper multilevel connection metallization on ICs can be used to construct stacks of copper-filled vias and trenches. Two or more such copper-filled vias or trenches, separated by oxide dielectrics, form an MOM capacitor.

The above-mentioned typical MOM capacitors, however, are all two-terminal type MOM capacitors. In some circumstances, such as the equivalent circuit diagrams shown in FIG. 2 and FIG. 3, two discrete, two-terminal MOM capacitors 22 and 24 are typically required to constitute the circuit configuration indicated by the dotted line region 20. The two discrete MOM capacitors 22 and 24 employed in the aforesaid exemplary equivalent circuit diagrams occupy a relatively larger circuit floor plan. It is often desirable to reduce the on-chip circuit elements such as the MOM capacitor in order to reduce the circuit floor plan because reducing circuit floor plan can improve circuit density.

SUMMARY OF THE INVENTION

It is one objective of the invention to provide an improved MOM capacitor that is more area efficient and has better electrical performance.

According to one embodiment of the invention, an MOM capacitor includes a first vertical metal plate; a second vertical metal plate in close proximity to the first vertical metal plate; a third vertical metal plate in close proximity to the first vertical metal plate, and at least one oxide layer interposed between the first, second and third vertical metal plates. The first, second and third vertical metal plate are connected to three different terminals of an integrated circuit.

In one aspect, according to another embodiment of the invention, an MOM capacitor includes; a first vertical metal plate; a second vertical metal plate in parallel with the first vertical metal plate, wherein the first and second vertical metal plates are both connected to a first terminal; a first segmental metal plate between the first and second vertical metal plates, the first segmental metal plate being connected to a second terminal; and a second segmental metal plate substantially aligned with the first segmental metal plate between the first and second vertical metal plates, wherein the second segmental metal plate is connected to a third terminal.

In accordance with another aspect of the invention, a capacitor includes a plurality of first-level conductive strips arranged in a first horizontal plane, each of the plurality of first-level conductive strips extending in parallel with each other in a first direction; and a plurality of second-level conductive strips arranged in a second horizontal plane higher than the first horizontal plane, each of the plurality of second-level conductive strips extending in parallel with each other in a second direction that is substantially not parallel to the first direction. The plurality of first-level conductive strips comprise a first conductive strip connected to a first terminal, a second conductive strip connected to a second terminal, and third conductive strip connected a third terminal. The second-level conductive strips comprise a fourth conductive strip connected to the first terminal, a pair of first segmental conductive strips sandwiching about the fourth conductive strip, and a pair of second segmental conductive strips sandwiching about the fourth conductive strip. The pair of first segmental conductive strips is connected to the second terminal and the pair of second segmental conductive strips is connected to the third terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
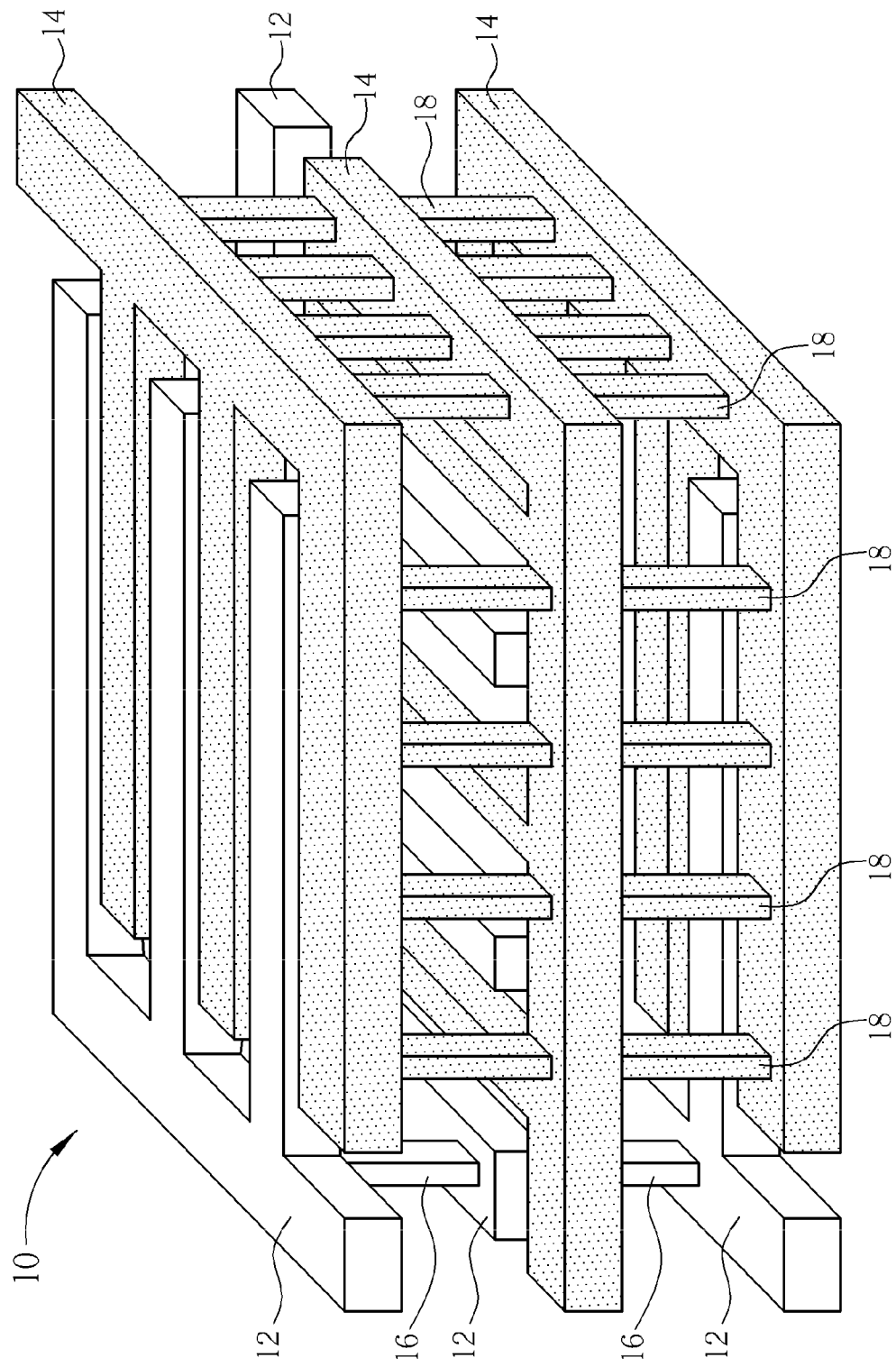
FIG. 1 illustrates a perspective view of a typical MOM capacitor according to the prior art.

One or more implementations of the present invention will now be described with reference to the attached drawings, wherein like reference numerals are used to refer to like elements throughout, and wherein the illustrated structures are not necessarily drawn to scale. The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

As devices become smaller and circuit density increases, it is critical that capacitors maintain their level of capacitance while taking up a smaller floor area on the circuit. Reducing circuit floor plan can improve circuit density and save cost. The compact, integral three-terminal (3T-) MOM capacitors of the embodiments can be used in the exemplary equivalent circuit diagrams shown in FIG. 2 or FIG. 3 to replace the two discrete, two-terminal MOM capacitors. Therefore, it is more area efficient than the prior art. Besides, the MOM capacitor can provide better electrical performance and is less mismatched capacitor.

Figure 2:
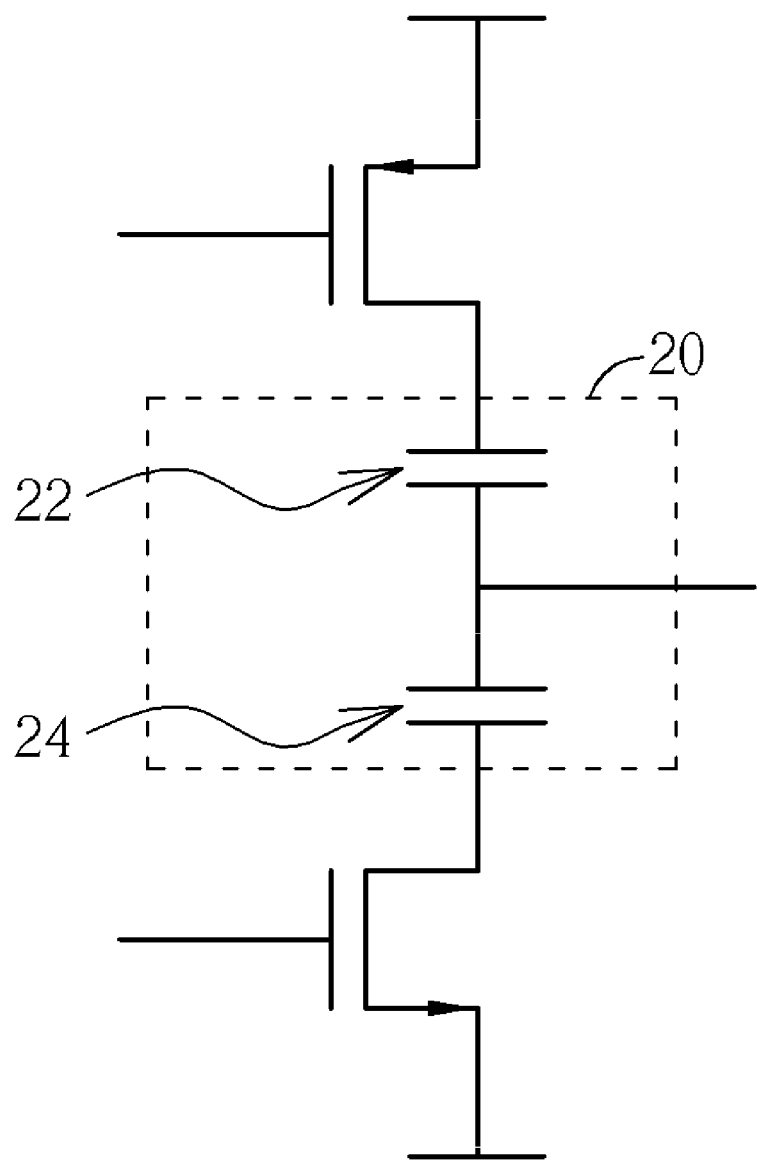
FIG. 2 and FIG. 3 are exemplary equivalent circuit diagrams employing discrete two-terminal MOM capacitors according to the prior art.
Figure 3:
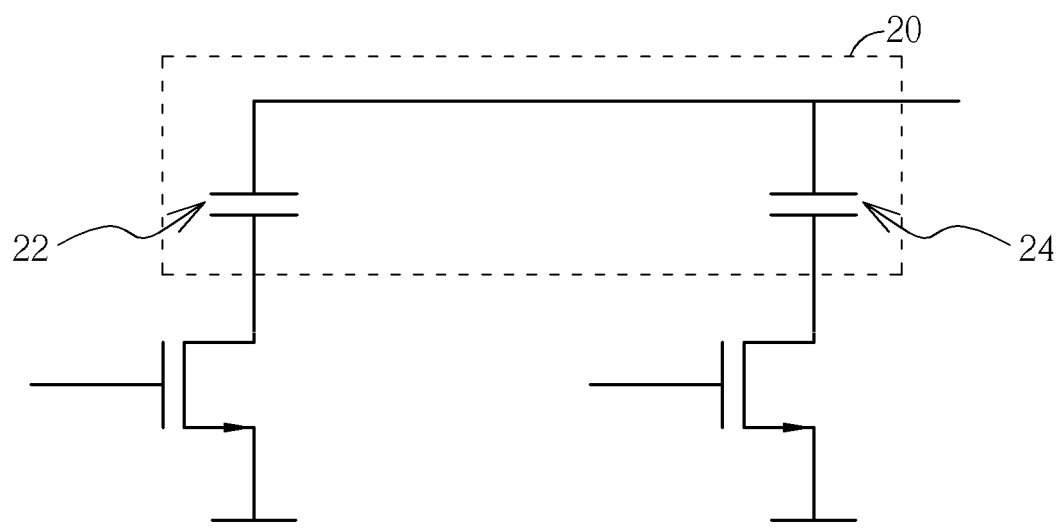

It is to be understood that the embodiments may be applicable to other circuit designs or applications in addition to the exemplary equivalent circuit diagrams shown in FIG. 2 or FIG. 3. For example, the novel 3T-MOM capacitors of the embodiments can be applied in the capacitor array bank of a digitally controlled crystal oscillator (DCXO) to save a large chip area. As known in the art, crystal oscillators, which are comprised of a crystal generally manufactured from quartz and an active amplifier that provides a negative resistance to perpetuate the oscillation, are widely used because they provide a relatively accurate clock/frequency source. They typically provide a better long-term quality clock than other available clock sources such as ceramic resonators, LC tank circuits, etc. The DCXO is the reference frequency oscillator that compensates for the frequency error of a crystal resonator and generates the reference frequency using both an analog circuit and a digital circuit.

Figure 4:
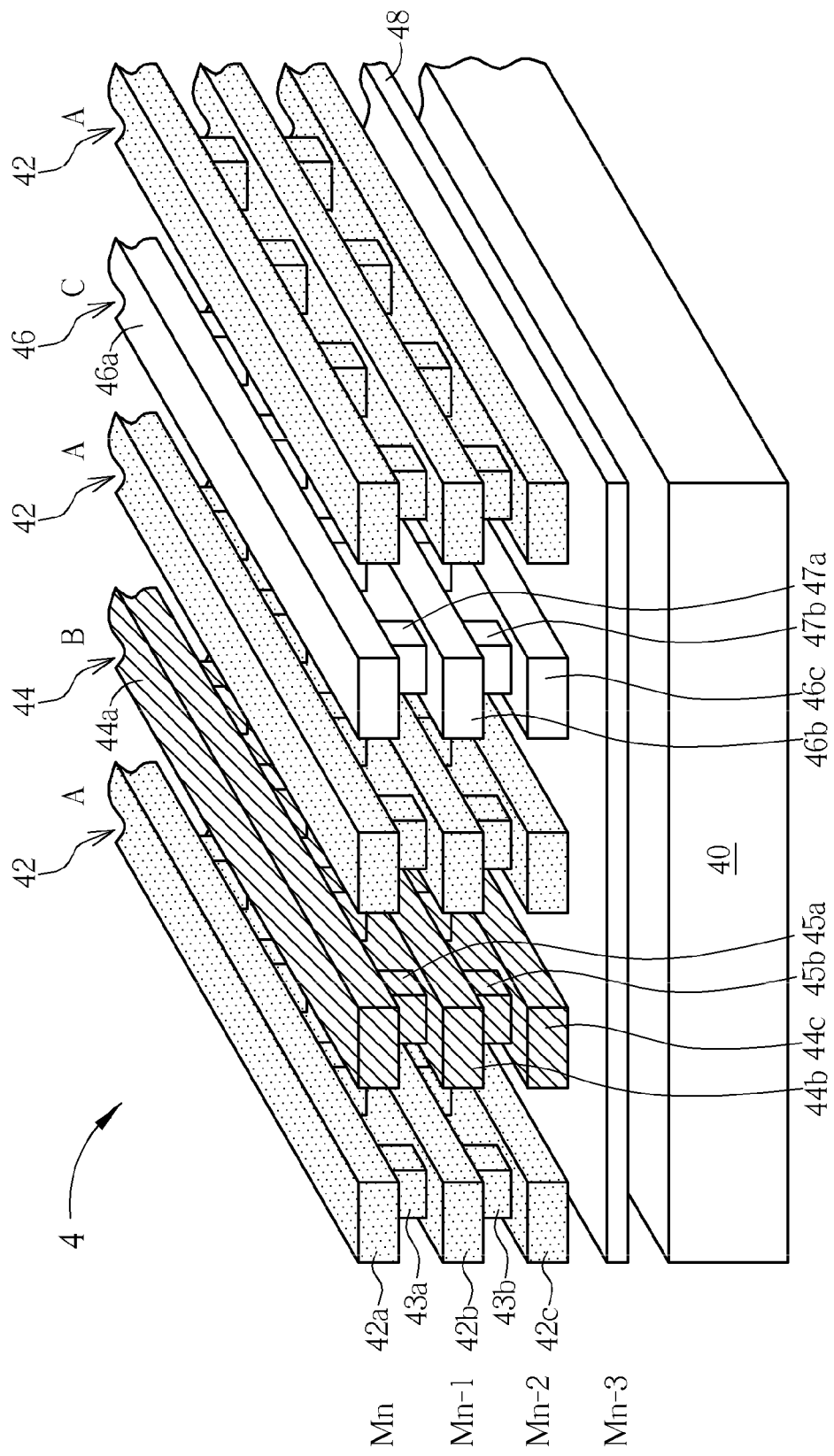
FIG. 4 is a perspective view fragmentarily showing a finger-type, three-terminal MOM capacitor in accordance with one embodiment of this invention.
Figure 5:
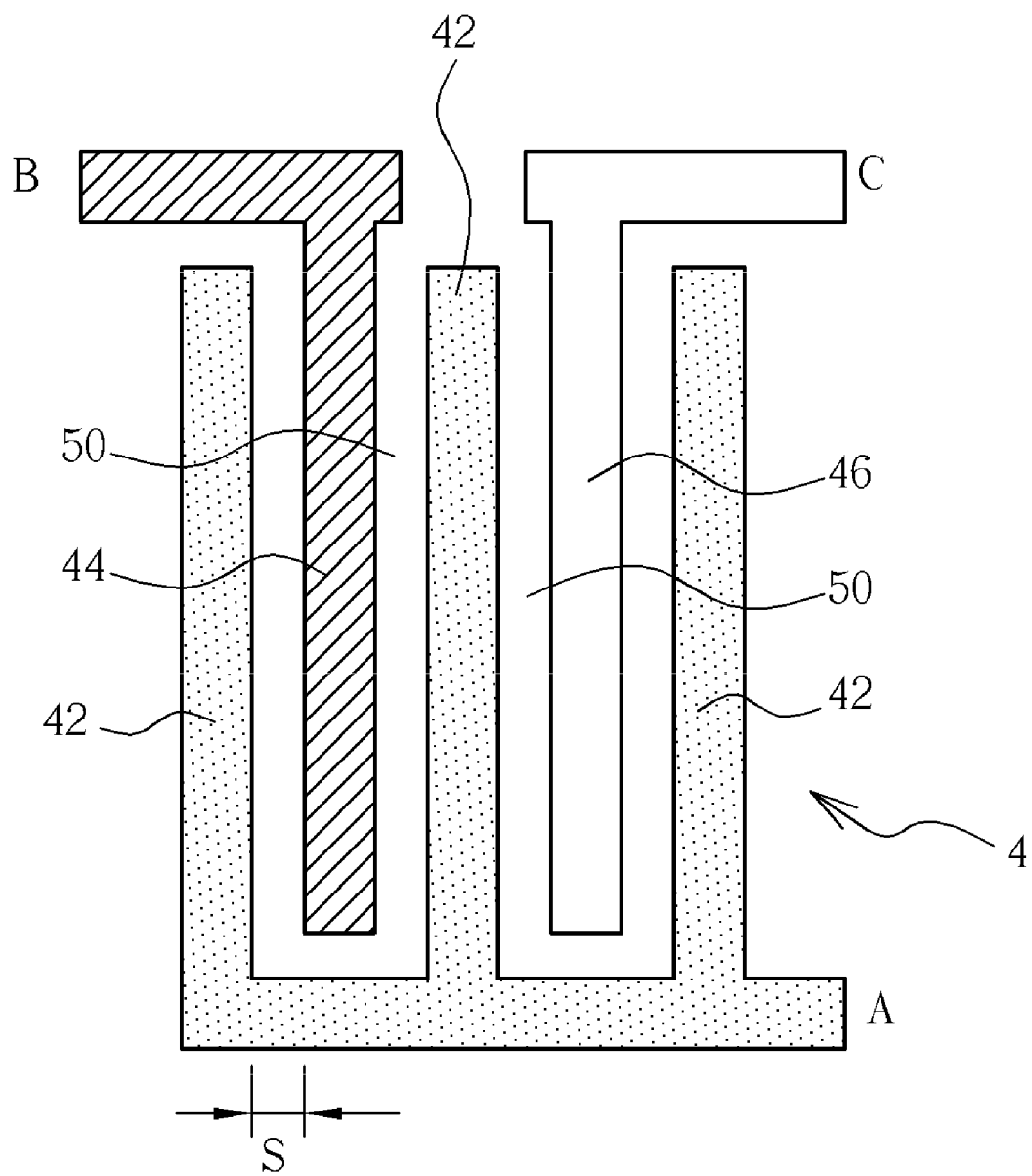
FIG. 5 is a schematic top view of the finger-type, three-terminal MOM capacitor of FIG. 4.

Please refer to FIG. 4 and FIG. 5. FIG. 4 is a perspective view fragmentarily schematically showing a finger-type, 3T-MOM capacitor in accordance with one embodiment of this invention. FIG. 5 is a schematic top view of the finger-type, 3T-MOM capacitor of FIG. 4. As shown in FIG. 4 and FIG. 5, the 3T-MOM capacitor 4, which is fabricated on a semiconductor substrate 40 and is formed as part of an integrated circuit, comprises a plurality of parallel-arranged vertical metal plates 42, 44 and 46. For the sake of simplicity, the inter-metal dielectric layers are omitted in FIG. 4. The vertical metal plates 42 are electrically connected to one common terminal, i.e., a terminal A, for example, ground or an output terminal; the vertical metal plate 44 is electrically connected to terminal B, for example, a source of a PMOS transistor; and the vertical metal plate 46 is electrically connected to terminal C, for example, a drain of a NMOS transistor. It is to be understood that there may be multiple vertical metal plates 44 and 46 in other embodiments although only one vertical metal plate 44 and only one vertical metal plate 46 are shown in FIG. 4. It is to be understood that the finger-type, 3T-MOM capacitor is fragmentary and the common bar or common plate for electrically connecting the three vertical metal plates 42 is not shown in FIG. 4.

Each of the vertical metal plates 42, 44 and 46 has a stack of conductive strips and vias, which could be fabricated concurrently with the metal connection structure in the ICs. For example, the vertical metal plate 42 comprises a metal strip 42a defined in the metal layer Mn, a metal strip 42b defined in the metal layer Mn-1, and a metal strip 42c defined in the metal layer Mn-2. The metal strip 42a is connected to the underlying metal strip 42b through vias 43a, and the metal strip 42b is connected to the underlying metal strip 42c through vias 43b. It is to be understood that the stack of conductive strips and vias may be implemented by using other conductive materials such as doped layers. Optionally, a metal shielding layer 48 that is defined in the metal layer Mn-3 or lower metal level may intervene between the 3T-MOM capacitor 4 and the semiconductor substrate 40. Further, it is understood that the vertical metal plates are not necessarily made of a plurality of metal layers, but instead may be made of one single layer in other cases.

Figure 6:
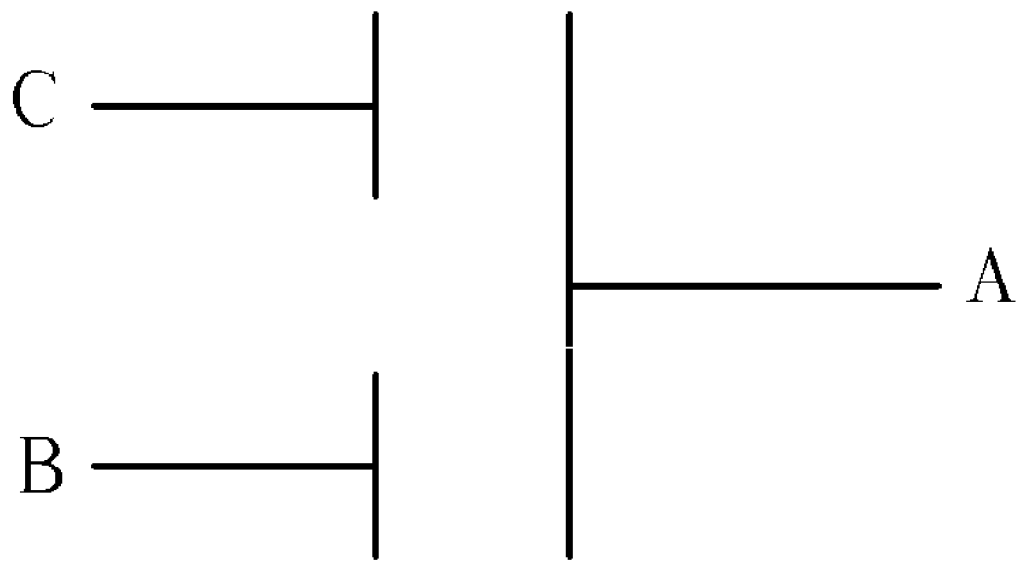
FIG. 6 is an equivalent circuit diagram of the 3T-MOM capacitor as depicted in FIG. 4 and FIG. 5.

The metal strips 42a, 42b, 42c, 44a, 44b, 44c, 46a, 46b, 46c and the vias 43a, 43b, 45a, 45b, 47a, 47b may be formed by conventional copper dual damascene processes and may include conductive materials including but not limited to W, Al, AlCu, Cu, Ti, TiSi2, Co, CoSi2, Ni. NiSi, TiN, TiW, Ta or TaN. As best seen in FIG. 5, the vertical metal plates 42, 44 and 46 are deployed in close proximity with at least one dielectric layer or oxide layer 50 interposed therebetween. For example, the space S between the vertical metal plates 42, 44 or between vertical metal plates 42, 46 is substantially of the minimum design rule. The aforesaid minimum design rule may refer to the minimum rule that is used in the fabrication of the integrated circuit chip or to the minimum rule that is used to fabricate a particular layer of the layered structure. An equivalent circuit diagram of the 3T-MOM capacitor as depicted in FIG. 4 and FIG. 5 is illustrated in FIG. 6.

Figure 7:
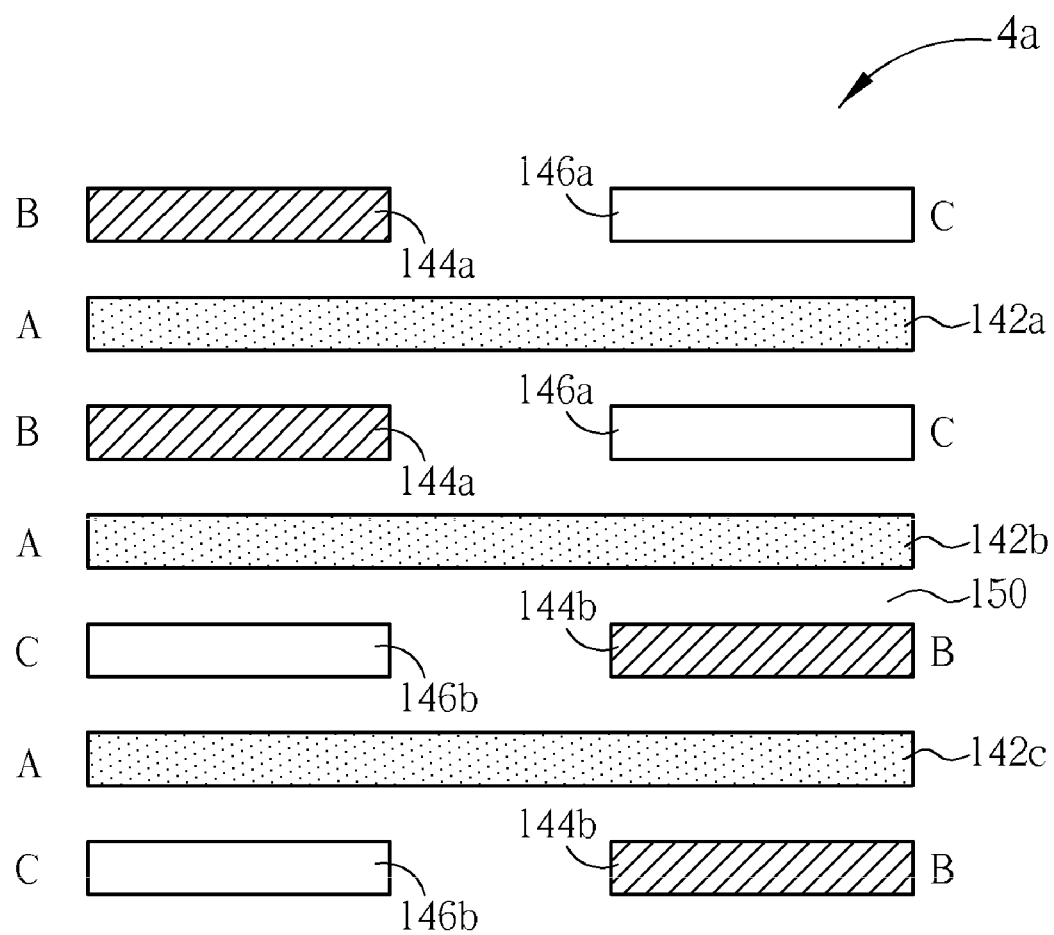
FIG. 7 is a schematic top view of a variant of the finger-type, 3T-MOM capacitor according to another embodiment of this invention.

Please refer to FIG. 7. FIG. 7 is a schematic top view of a variant of the finger-type, 3T-MOM capacitor according to another embodiment of this invention. As shown in FIG. 7, the finger-type, 3T-MOM capacitor 4a comprises a plurality of parallel-arranged vertical metal plates 142a, 142b, 142c, which are connected to a common terminal A, for example, ground or an output terminal. A segmental metal plate 144a and a segmental metal plate 146a intervene between the vertical metal plates 142a and 142b, wherein the segmental metal plate 144a is connected to a terminal B and the segmental metal plate 146a is connected to a terminal C. The segmental metal plate 144a is substantially aligned with the segmental metal plate 146a in a lateral direction. More specifically, the segmental metal plate 144a and the segmental metal plate 146a are arranged side-by-side along the lateral direction. A pair of segmental metal plates 144a and a pair of segmental metal plates 146a sandwich about the vertical metal plate 142a. Opposite to the segmental metal plate 144a and the segmental metal plate 146a, a segmental metal plate 144b and a segmental metal plate 146b intervene between the vertical metal plates 142b and 142c, likewise, the segmental metal plate 144b is connected to a terminal B and the segmental metal plate 146b is connected to a terminal C. The segmental metal plate 144a and the segmental metal plate 146b sandwich about the vertical metal plate 142b. The segmental metal plate 146a and the segmental metal plate 144b sandwich about the vertical metal plate 142b. A pair of segmental metal plates 144b and a pair of segmental metal plates 146b sandwich about the vertical metal plate 142c. At lease one dielectric layer or oxide layer 150 such as silicon oxide is between the metal plates. The oxide layer 150 acts as a capacitor dielectric. For example, the segmental metal plate 146b is electrically isolated from the segmental metal plate 144b by dielectric material 150.

In one aspect, FIG. 7 further embodies a metal-oxide-metal (MOM) capacitor comprising a first vertical metal plate 142b connected to a first terminal (terminal A); a second vertical metal plate 144a in close proximity to the first vertical metal plate 142b, the second vertical metal plate 144a being connected to a second terminal (terminal B); a third vertical metal plate 146b in close proximity to the first vertical metal plate 142b, wherein the third vertical metal plate 146b is disposed on one side of the first vertical metal plate 142b opposite to the second vertical metal plate 144a, and wherein the third vertical metal plate 146b is connected to a third terminal (terminal C); and at least one oxide layer 150 interposed between the first, second and third vertical metal plates, wherein the second vertical metal plate 144a is substantially placed in juxtaposition to the third vertical metal plate 146b.

In another aspect, FIG. 7 further embodies a metal-oxide-metal (MOM) capacitor comprising a first vertical metal plate 142c connected to a first terminal (terminal A); a second vertical metal plate 144b in close proximity to the first vertical metal plate 142c, the second vertical metal plate 144b being connected to a second terminal (terminal B); a third vertical metal plate 146b in close proximity to the first vertical metal plate 142c, wherein the third vertical metal plate 146b is disposed on one side of the first vertical metal plate 142c opposite to the second vertical metal plate 144b, and wherein the third vertical metal plate 146b is connected to a third terminal (terminal C); and at least one oxide layer 150 interposed between the first, second and third vertical metal plates, wherein the second vertical metal plate 144b is substantially placed in a catercorner malposition with respect to the third vertical metal plate 146b, and wherein the second vertical metal plate 144b is substantially placed in juxtaposition to a fourth vertical metal plate 144b connected to the second terminal (terminal B), wherein the fourth vertical metal plate 144b is aligned with the third vertical metal plate 146b on the same side of the first vertical metal plate 142c.

Figure 8:
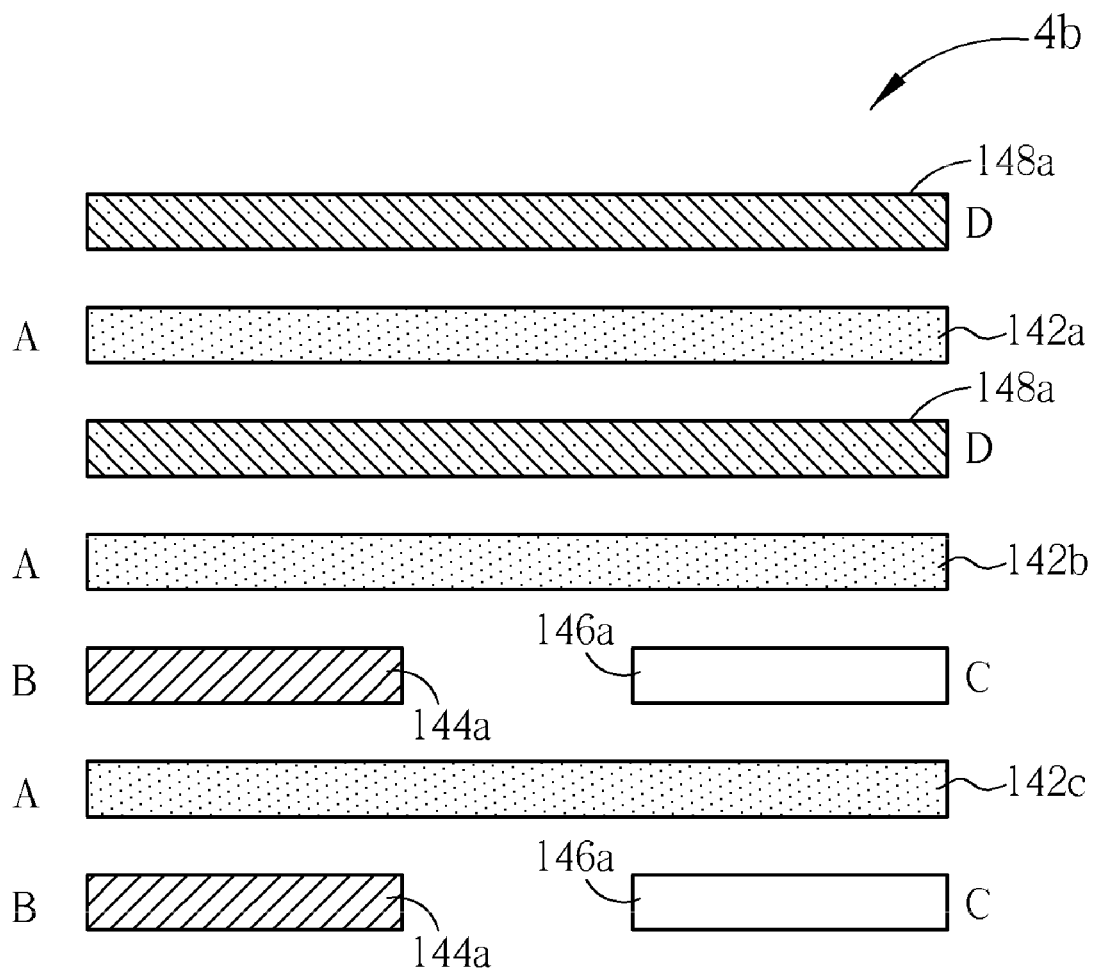
FIG. 8 is a schematic top view of an exemplary finger-type, four-terminal MOM capacitor according to yet another embodiment of this invention.

It is understood that the MOM capacitor of this invention may have more than three terminals such as four terminals or five terminals without departing from the spirit of the invention. FIG. 8 is a schematic top view of an exemplary finger-type, four-terminal (4T-) MOM capacitor according to yet another embodiment of this invention. As shown in FIG. 8, the 4T-MOM capacitor 4b comprises a plurality of parallel-arranged vertical metal plates 142a, 142b, 142c, which are connected to a common terminal A, for example, ground or an output terminal. A pair of vertical metal plates 148a, which is connected to the terminal D, sandwiches about the vertical metal plate 142a. A pair of segmental metal plates 144a, which is connected to the terminal B, and a pair of segmental metal plates 146a, which is connected to the terminal C, sandwiches about the vertical metal plate 142c.

Figure 9:
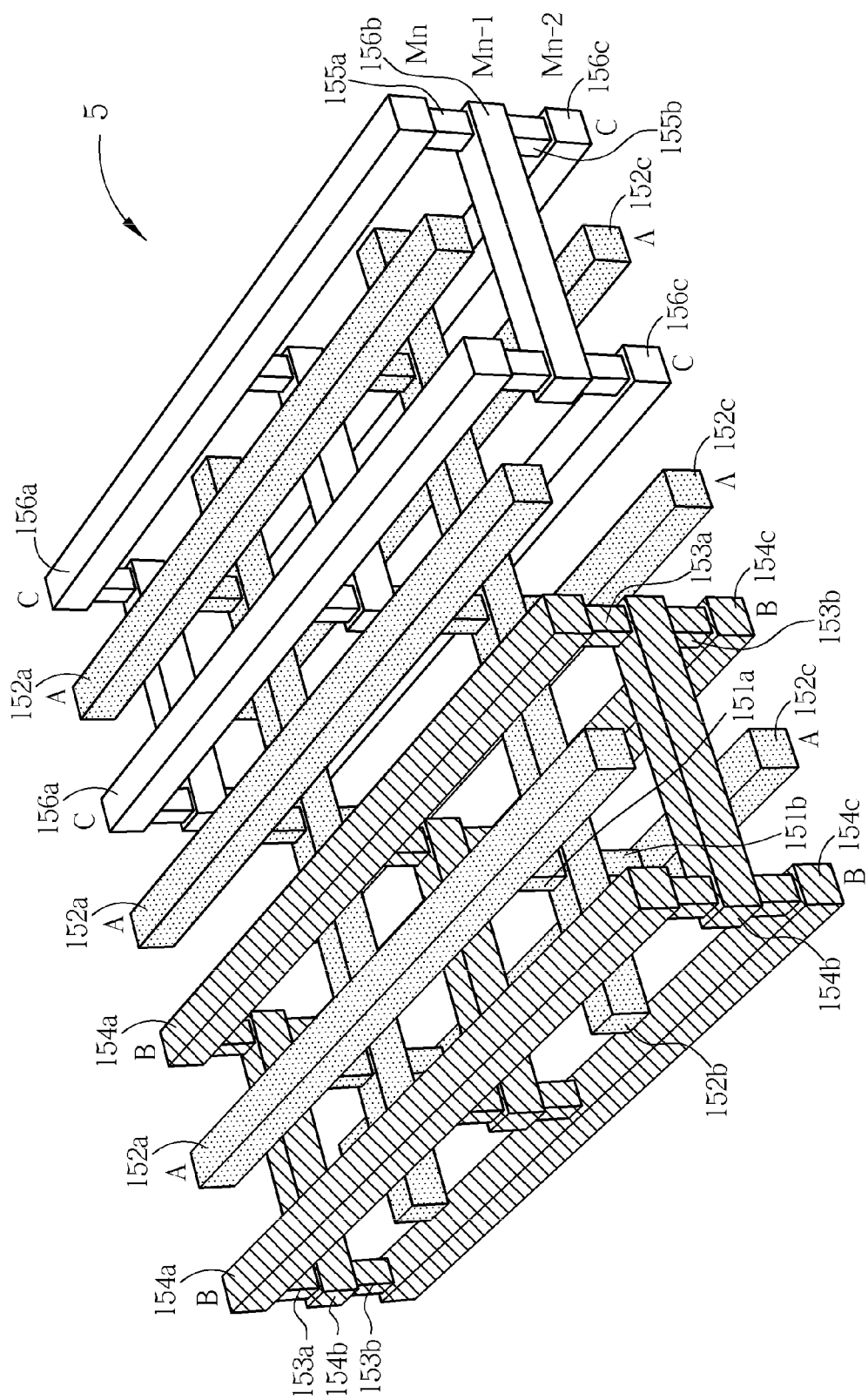
FIG. 9 is a perspective view fragmentarily showing a woven-type, 3T-MOM capacitor in accordance with yet another embodiment of this invention.
Figure 10:
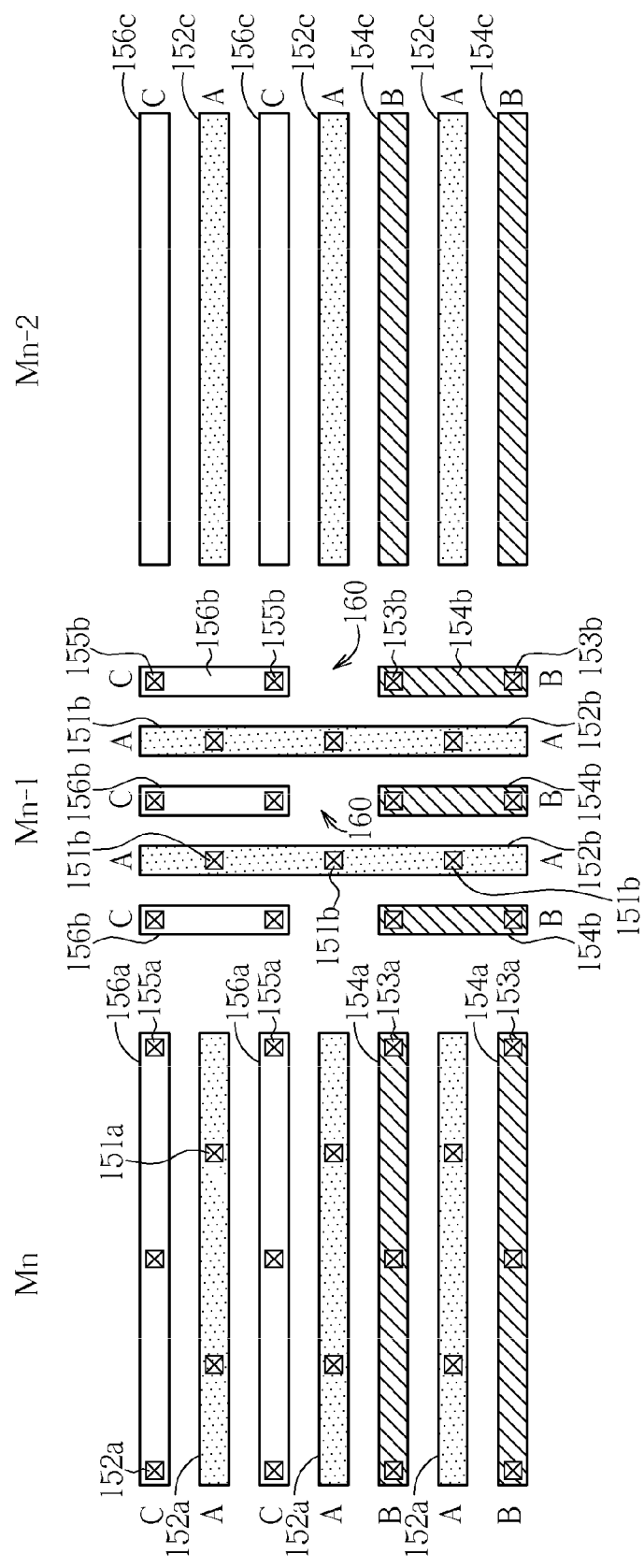
FIG. 10 is a plan view showing the layout of metal strips defined in different metal layers of the woven-type, 3T-MOM capacitor of FIG. 9.

Please refer to FIG. 9 and FIG. 10. FIG. 9 is a perspective view fragmentarily showing a woven-type, 3T-MOM capacitor in accordance with yet another embodiment of this invention. FIG. 10 is a plan view showing the layout of metal strips defined in respective metal levels of the woven-type, 3T-MOM capacitor of FIG. 9, wherein the inter-metal dielectric is omitted for the sake of simplicity. As shown in FIG. 9 and FIG. 10, the woven-type, 3T-MOM capacitor 5 comprises a plurality of conductive strips 152a, 154a and 156a, which are defined in the metal layer Mn. The conductive strips 152a, 154a and 156a are alternately arranged and extend in parallel with each other in a first direction (or so-called lateral direction). The conductive strips 152a are connected to the common terminal A, for example, ground or an output terminal. The conductive strips 154a are connected to the terminal B. The conductive strips 156a are connected to the terminal C. The terminals A, B and C are three different terminals or nodes in a circuit. Each of the conductive strips 152a, 154a and 156a is a continuous, straight line-shaped strip and no discontinuity is formed in the strips according to this embodiment.

As best seen in FIG. 10, a plurality of conductive strips 152b and a plurality of segmental conductive strips 154b and 156b, which are defined in the metal layer Mn-1, are provided underlying the conductive strips 152a, 154a and 156a. The conductive strips 152b, 154b and 156b are alternately arranged and extend in parallel with each other in a second direction (or so called longitudinal direction). It is to be understood that the first direction is not parallel with the second direction. More particularly, the first direction crosses the second direction such that the conductive strips form a woven-type conductor, and therefore the first direction and the second direction have not to be limited as substantially particular to each other as illustrated in the embodiment. The conductive strips 152b are connected to the overlying conductive strips 152a through vias 151a and are therefore connected to the terminal A. The segmental conductive strips 154b are connected to the overlying conductive strips 154a through vias 153a and are therefore connected to the terminal B. The segmental conductive strips 156b are connected to the overlying conductive strips 156a through vias 155a and are therefore connected to the same terminal C. Since the segmental conductive strip 154b and the segmental conductive strip 156b are connected to different terminals, a discontinuity 160 is provided between the conductive strip 154b and the conductive strip 156b arranged in the same row.

In the metal layer Mn-2, a plurality of conductive strips 152c, 154c and 156c are laid underlying the conductive strips 152b and the segmental conductive strips 154b and 156b. The conductive strips 152c, 154c and 156c are alternately arranged and extend in parallel with each other in a lateral direction. The conductive strips 152c are connected to the terminal A. The conductive strips 154c are connected to the terminal B. The conductive strips 156c are connected to the terminal C. The conductive strips 152c are connected to the overlying conductive strips 152b through vias 151b. The conductive strips 154c are connected to the overlying segmental conductive strips 154b through vias 153b. The conductive strips 156c are connected to the overlying segmental conductive strips 156b through vias 155b.

Figure 11:
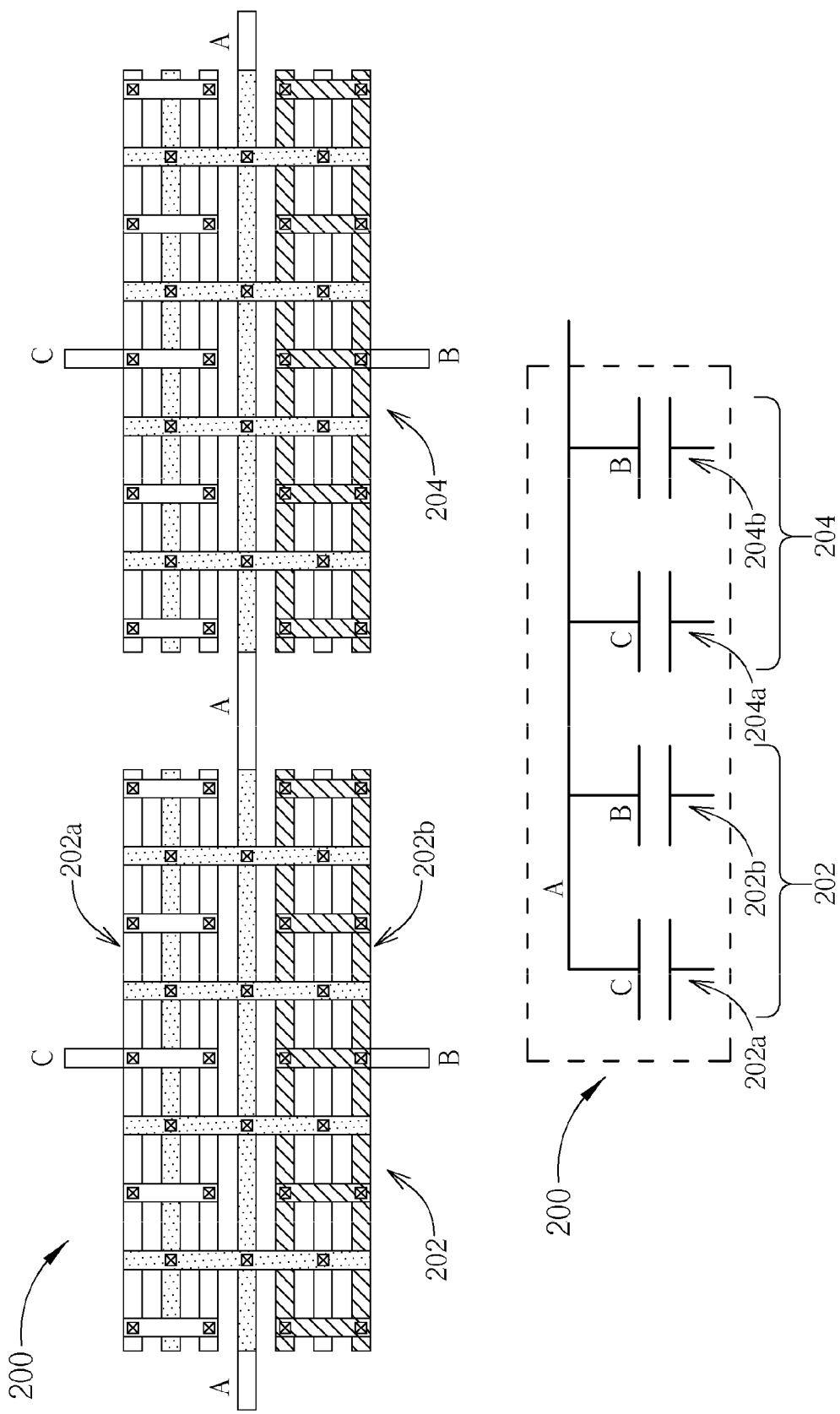
FIG. 11 is a schematic top view showing a portion of a capacitor array bank in accordance with another embodiment of this invention.

FIG. 11 is a schematic top view showing a portion of a capacitor array bank in accordance with another embodiment of this invention, wherein an equivalent circuit diagram is shown in the lower portion of this figure. As shown in FIG. 11, the capacitor array bank 200 comprises a plurality of capacitor elements, for example, capacitor elements 202a, 202b, 204a and 204b, all having a common terminal A. The capacitor element 202a is integrated with the capacitor element 202b into one single 3-T MOM capacitor 202. The capacitor element 204a is integrated with the capacitor element 204b into one single 3-T MOM capacitor 204. Both of the 3-T MOM capacitors 202 and 204 have a similar structure as that set forth in FIGS. 4-10. Such configuration is beneficial because a large chip area can be saved and is less mismatch capacitor array bank. Such capacitor array bank 200 is particularly suited for a digitally controlled crystal oscillator (DCXO) circuit.

Those skilled in the art will readily observe that numerous modifications and alterations of the device and method may be made while retaining the teachings of the invention.

What is claimed is:

1. A metal-oxide-metal (MOM) capacitor, comprising:
a first vertical metal plate connected to a first terminal;
a second vertical metal plate in close proximity to the first vertical metal plate, the second vertical metal plate being connected to a second terminal;
a third vertical metal plate in close proximity to the first vertical metal plate, wherein the third vertical metal plate is disposed on one side of the first vertical metal plate opposite to the second vertical metal plate, and wherein the third vertical metal plate is connected to a third terminal; and
at least one oxide layer interposed between the first, second and third vertical metal plates.

2. The MOM capacitor according to claim 1 wherein the first terminal, the second terminal and the third terminal are three different terminals of an integrated circuit.

3. The MOM capacitor according to claim 1 wherein a space between the first and second vertical metal plates or between the first and third vertical metal plates is substantially of a minimum design rule.

4. The MOM capacitor according to claim 1 wherein each of the first, second and third vertical metal plates is comprised of stacked metal strips.

5. The MOM capacitor according to claim 4 wherein the stacked metal strips are connected by vias.

6. The MOM capacitor according to claim 1 wherein the second vertical metal plate is substantially placed in juxtaposition to the third vertical metal plate.

7. The MOM capacitor according to claim 1 wherein the second vertical metal plate is substantially placed in a cater-corner malposition with respect to the third vertical metal plate.

8. The MOM capacitor according to claim 1 wherein the second vertical metal plate is substantially placed in juxtaposition to a fourth vertical metal plate connected to the second terminal, wherein the fourth vertical metal plate is substantially aligned with the third vertical metal plate on the same side of the first vertical metal plate.

9. A metal-oxide-metal (MOM) capacitor, comprising:
a first vertical metal plate;
a second vertical metal plate in parallel with the first vertical metal plate, wherein the first and second vertical metal plates are both connected to a first terminal;
a first segmental metal plate between the first and second vertical metal plates, the first segmental metal plate being connected to a second terminal; and
a second segmental metal plate substantially aligned with the first segmental metal plate between the first and second vertical metal plates, wherein the second segmental metal plate is connected to a third terminal.

10. The MOM capacitor according to claim 9 wherein the first segmental metal plate is electrically isolated from the second segmental metal plate by at least one oxide layer.

11. The MOM capacitor according to claim 9 wherein the first terminal, the second terminal and the third terminal are three different terminals of an integrated circuit.

12. The MOM capacitor according to claim 9 further comprising a third vertical metal plate in close proximity to the first vertical metal plate and in parallel with the first vertical metal plate, wherein the third vertical metal plate is connected to a fourth terminal.

13. A capacitor, comprising:
a plurality of first-level conductive strips arranged in a first horizontal plane, each of the plurality of first-level conductive strips extending in parallel with each other in a first direction, wherein the plurality of first-level conductive strips comprise a first conductive strip connected to a first terminal, a second conductive strip connected to a second terminal, and third conductive strip connected a third terminal; and
a plurality of second-level conductive strips arranged in a second horizontal plane higher than the first horizontal plane, each of the plurality of second-level conductive strips extending in parallel with each other in a second direction that is not parallel to the first direction, wherein the second-level conductive strips comprise a fourth conductive strip connected to the first terminal, a pair of first segmental conductive strips sandwiching about the fourth conductive strip, and a pair of second segmental conductive strips sandwiching about the fourth conductive strip, and wherein the pair of first segmental conductive strips is connected to the second terminal and the pair of second segmental conductive strips is connected to the third terminal.

14. The capacitor according to claim 13 wherein a discontinuity is formed between the first segmental conductive strip and the second segmental conductive strip.

15. The capacitor according to claim 13 wherein the first conductive strip is electrically connected to the fourth conductive strip through a first via.

16. The capacitor according to claim 13 wherein the second conductive strip is electrically connected to the pair of first segmental conductive strips through a second via.

17. The capacitor according to claim 13 wherein the third conductive strip is electrically connected to the pair of second segmental conductive strips through a third via.

18. The capacitor according to claim 13 wherein the first terminal, the second terminal and the third terminal are three different terminals of an integrated circuit.

* * * * *